United States Patent
Rao et al.

(10) Patent No.: US 12,355,227 B2
(45) Date of Patent: Jul. 8, 2025

(54) INDUSTRIAL CONTROL APPARATUS AND MONITORING METHOD FOR INDUSTRIAL CONTROL APPARATUS

(71) Applicant: ABB Schweiz AG, Baden (CH)

(72) Inventors: Lihong Rao, Hangzhou (CN); Huan Shi, Hangzhou (CN); Wei Liu, Hangzhou (CN); Robert Norberg, Eskilstuna (SE)

(73) Assignee: ABB SCHWEIZ AG, Baden (CH)

( * ) Notice: Subject to any disclaimer, the term of this patent is extended or adjusted under 35 U.S.C. 154(b) by 209 days.

(21) Appl. No.: 18/317,490

(22) Filed: May 15, 2023

(65) Prior Publication Data
US 2023/0387676 A1    Nov. 30, 2023

(30) Foreign Application Priority Data

May 30, 2022  (CN) .......................... 202210601383.2

(51) Int. Cl.
*H02H 3/04* (2006.01)
*G05B 19/4155* (2006.01)
*H02H 1/00* (2006.01)

(52) U.S. Cl.
CPC ......... *H02H 3/046* (2013.01); *G05B 19/4155* (2013.01); *H02H 1/0007* (2013.01); *G05B 2219/31449* (2013.01)

(58) Field of Classification Search
CPC .... H02H 3/046; H02H 1/0007; H02H 1/0061; G05B 19/4155; G05B 2219/31449; G05B 19/0423; G05B 2219/24215; H01H 85/30; G01R 31/74
See application file for complete search history.

(56) References Cited

U.S. PATENT DOCUMENTS

| | | | |
|---|---|---|---|
| 10,348,080 B1* | 7/2019 | Meng | ................... G01R 31/007 |
| 11,936,740 B2* | 3/2024 | Mehmedagic | ...... H04L 41/0226 |
| 2010/0023286 A1* | 1/2010 | Rodseth | ................. H02H 3/046 |
| | | | 702/65 |
| 2010/0271045 A1 | 10/2010 | Oka | |
| 2015/0130477 A1 | 5/2015 | Berland | |
| 2015/0228435 A1 | 8/2015 | Hudetz | |
| 2018/0025877 A1 | 1/2018 | Froehner | |
| 2019/0214808 A1 | 7/2019 | Meng | |
| 2019/0228156 A1* | 7/2019 | Thumati | ................. G06F 21/50 |

FOREIGN PATENT DOCUMENTS

CN           104603906 A      5/2015

* cited by examiner

*Primary Examiner* — Jermele M Hollington
*Assistant Examiner* — Zannatul Ferdous
(74) *Attorney, Agent, or Firm* — Greenberg Traurig, LLP

(57) ABSTRACT

Embodiments of the present disclosure provide industrial control apparatus and monitoring methods for industrial control apparatus. The industrial control apparatus comprises: at least one input or output module, each input or output module comprising a fuse adapted to be coupled between a power supply and a user load, and a detection assembly coupled to the fuse and configured to send a detection signal after monitoring that the fuse is blown; and a processing device communicatively coupled to the detection assembly of each input or output module and configured to output information that the input or output module associated with the detection signal is blown. By the aspects of the present disclosure, it is advantageous for an operator to timely obtain information that the fuse is blown and to improve the efficiency of locating and replacing the fuse.

7 Claims, 4 Drawing Sheets

○ System1
　⊟ Module group A
　　▱ 1　DO　XXX
　　⊗ 2　AO　XXX
　　▱ 3　AI　XXX
　　▱ 4　DO　XXX
　⊟ Module group B
　　▱ 2　AO　XXX
　　▱ 3　AI　XXX
　　▱ 5　DI　XXX
　⊞ Module group C
　⊞ Module group D

FIG. 3

INDUSTRIAL CONTROL APPARATUS AND MONITORING METHOD FOR INDUSTRIAL CONTROL APPARATUS

CROSS-REFERENCE TO RELATED APPLICATIONS

This application claims priority to Chinese patent application Serial No.: 202210601383.2, filed May 30, 2022; which is herein incorporated by reference in its entirety.

FIELD

Embodiments of the present disclosure generally relate to the field of industrial control, and more particularly, to an industrial control apparatus and a fuse monitoring method for an industrial control apparatus.

BACKGROUND

Industrial control refers to the use of computer technology, electrical and electronic technology and other means to automate and efficient the production and manufacturing of factories, with controllability and visibility. Industrial control technology has greatly improved the production speed and efficiency of factories, and has been widely used in various industrial fields such as power, manufacturing, transportation and so on.

Industrial controllers often need to provide various selection modules, such as input or output modules (select IO). Replaceable fuses may be provided in the selection module for safe power supply of the user's load. However, in order to determine whether the fuse has blown and needs to be replaced, an operator needs to go to a field facility such as a cabinet, for example, to turn on the cabinet so as to check the indicator light corresponding to the fuse. It can be seen that it is currently difficult for an operator to quickly and timely obtain the blown state of a fuse, and also to quickly determine which fuse in a selection module needs to be replaced, resulting in cumbersome troubleshooting, and failure to timely replace the fuse and troubleshoot.

SUMMARY

To at least partially address the above and other potential problems, embodiments of the present disclosure provides an industrial control apparatus and a monitoring method for an industrial control apparatus.

According to a first aspect of the present disclosure, there is provided an industrial control apparatus comprising at least one input or output module, and each input or output module comprises a fuse adapted to be coupled between a power supply and a user load; and a detection assembly coupled to the fuse and configured to send a detection signal after monitoring that the fuse is blown. The industrial control apparatus further comprises a processing device communicatively coupled to the detection assembly of each input or output module and configured to output information that the input or output module associated with the detection signal is blown.

In some embodiments of the present disclosure, the information that the input or output module associated with the detection signal is blown comprises at least one of: identification information and position information of the input or output module associated with the detection signal.

In some embodiments of the present disclosure, the detection assembly comprises: at least one resistive device; an isolation device comprising: a first side portion connected in series with the at least one resistive device, the first side portion and the at least one resistive device connected in series being connected in parallel with the fuse; and a second side portion configured to send a valid signal when a current flowing through or a voltage applied to the first side portion exceeds a threshold; and a control component coupled to the second side portion and the processing device, the control component being configured to receive the valid signal and to send the detection signal to the processing device based on the valid signal.

In some embodiments of the present disclosure, the isolation device comprises an optical coupler.

In some embodiments of the present disclosure, the processing device further comprises a human-machine interface configured to present information that the input or output module is blown to the operator in the form of at least one of a character, a graphic and a sound.

In some embodiments of the present disclosure, the industrial control apparatus further comprises: a cabinet body; and at least one module group arranged in the cabinet body, wherein each module comprises a plurality of bases, and at least one input or output module is mounted on a corresponding base of a corresponding module respectively.

According to a second aspect of the present disclosure, there is provided a monitoring method for an industrial control apparatus, and the monitoring method comprises: sending, by a detection assembly, a detection signal after monitoring that a fuse in a respective input or output module is blown, wherein the industrial control apparatus comprises at least one input or output module, and each input or output module comprises the fuse and the detection assembly; and outputting, by the processing device, information that the input or output module associated with the detection signal is blown.

In some embodiments of the present disclosure, the information that the input or output module associated with the detection signal is blown comprises at least one of: identification information and position information of the input or output module associated with the detection signal.

In some embodiments of the present disclosure, the detection assembly comprises at least one resistive device, an isolation device, and a control component, and the isolation device comprises a first side portion and a second side portion. The first side portion is connected in series with the at least one resistive device, the first side portion and the at least one resistive device connected in series are connected in parallel with the fuse, and the control component is coupled to the second side portion and the processing device, and wherein sending, by a detection assembly, a detection signal after monitoring that a fuse in a respective input or output module is blown comprises: sending, by the second side portion of the isolation device, a valid signal when a current flowing through or a voltage applied to the first side portion exceeds a threshold, and sending, by the control component, the detection signal to the processing device based on the received valid signal.

In some embodiments of the present disclosure, the monitoring method further comprises: outputting, by a human-machine interface, information that an input or output module associated with the detection signal is blown, wherein the outputting comprises: presenting information that the input or output module is blown to the operator in the form of at least one of a character, a graphic and a sound through the human-machine interface.

This Summary is provided to introduce a selection of concepts in a simplified form that are further described below in the Detailed Description. This Summary is not intended to identify key features or essential features of the present disclosure, nor is it intended to be used to limit the scope of the present disclosure.

BRIEF DESCRIPTION OF THE DRAWINGS

Through the following detailed description with reference to the accompanying drawings, the above and other objectives, features, and advantages of example embodiments of the present disclosure will become more apparent. In the example embodiments of the present disclosure, the same reference numerals usually refer to the same components.

FIG. 3 illustrates a schematic diagram of a processing device according to an embodiment of the present disclosure;

DETAILED DESCRIPTION OF EMBODIMENTS

Embodiments of the present disclosure will be described in more details below with reference to the drawings. Although the drawings illustrate preferred embodiments of the present disclosure, it should be appreciated that the present disclosure can be implemented in various manners and should not be limited to the embodiments explained herein. On the contrary, the embodiments are provided to make the present disclosure more thorough and complete and to fully convey the scope of the present disclosure to those skilled in the art. Alternative embodiments will occur to those skilled in the art from the following description without departing from the spirit and scope of the present disclosure.

As used herein, the term "comprises" and its variants are to be read as open-ended terms that mean "comprises, but is not limited to." The term "or" is to be read as "and/or" unless the context clearly indicates otherwise. The term "based on" is to be read as "based at least in part on." The terms "one example embodiment" and "one embodiment" are to be read as "at least one example embodiment." The following text also can include other explicit and implicit definitions.

Embodiments of the present disclosure provide a monitoring scheme for industrial control apparatus. In this scheme, the detection assembly in the input or output module may provide an indication signal to the processing device after the fuse of the module has blown and the processing device outputs information of the module that has blown. In this manner, information that the fuses of the module are blown can be quickly and timely provided to the operator, which facilitates the operator to timely detect the blowing event, accurately locate and replace the fuses, and troubleshoot the failure.

Figure 1:
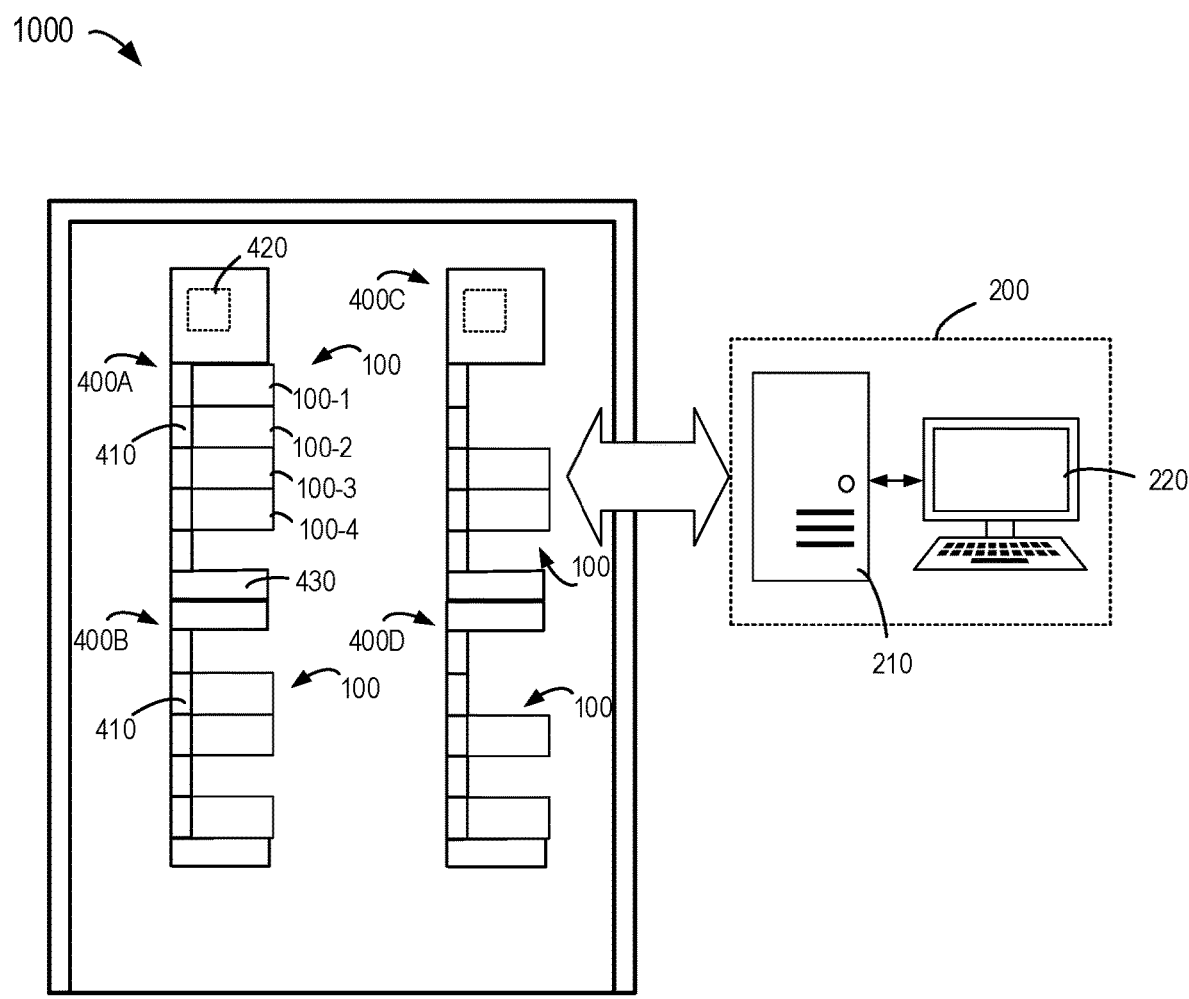
FIG. 1 illustrates a schematic diagram of an industrial control apparatus according to an embodiment of the present disclosure.

FIG. 1 illustrates a schematic diagram of an industrial control apparatus 1000 according to an embodiment of the present disclosure. As shown in FIG. 1, an industrial control apparatus 1000 may include at least one input or output module 100, such as input or output modules 100-1, 100-2, 100-3, and 100-4. As an example, an input module may collect various measurement signals or electrical signals required from an industrial control site for processing by an industrial control apparatus, while an output module may output signals to actuators of the industrial site to control a production process in the site. In one embodiment, the at least one output or output module 100 may include at least one of a digital input module, a digital output module, an analog input module, and an analog output module. Digital input modules and digital output modules may be used for input and output of digital quantities, while analog input modules and digital output modules may be used for input and output of analog quantities.

In some embodiments of the present disclosure, the industrial control apparatus 1000 further comprises a cabinet 300 and at least one module group disposed in the cabinet 300, and each module group comprises a plurality of bases 410, and at least one input or output module 100 are respectively mounted on the corresponding base 410 of the corresponding module group.

By way of example, the cabinet 300 may be a closed cabinet with a cabinet door. One or more module groups may be disposed within the cabinet 300, for example, a plurality of module groups 400A, 400B, 400C, and 400D shown in FIG. 1, wherein these module groups may be electrically connected together. It is understood that the number of module groups is not limited thereto, and five or more module groups may be provided as needed, or only one, two or three module groups may be provided. Each module group may be provided with a plurality of input or output modules 100, for example, the left uppermost module group 400A in the cabinet 300 in FIG. 1 may be provided with four input or output modules 100-1, 100-2, 100-3 and 100-4, respectively, on its plurality of bases 410. The number of bases 410 per module group is not limited and may be other suitable numbers, for example each module group may have 16 bases to receive up to 16 input or output modules. In one embodiment, a communication unit 420 may be provided for a module group or module groups for forwarding signals or data from or to all input or output modules 100 of the module group or module groups. In one embodiment, each module may also include a Power Terminal Block 430 for providing power. The plurality of input or output modules 100, the plurality of module groups and the plurality of bases of each module group in the cabinet 300 may respectively have identification information, such as a number and a model, so that an operator can search for a corresponding component in the cabinet 300 according to the identification information and know the basic condition of the corresponding component. The cabinet 300 with the module groups 400A, 400B, 400C, 400D and the input or output module 100 installed may be placed near an industrial site. Thus, the placement and installation of industrial control apparatus can be accomplished near an industrial site and the electrical and electronic components within the cabinet 300, such as the module groups 400A, 400B and the input or output module 100, are protected from the harsh environment of the industrial site.

Figure 2:
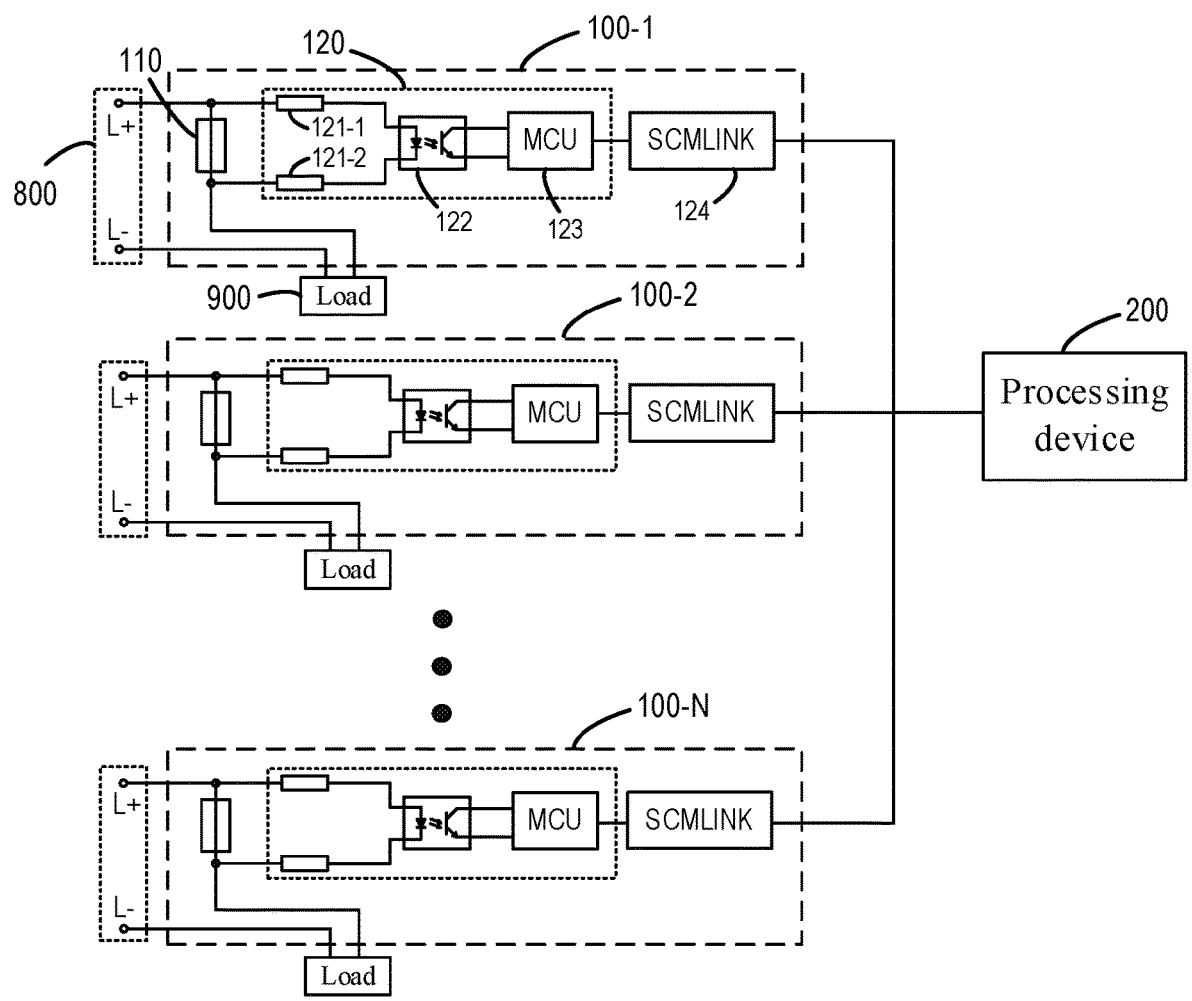
FIG. 2 illustrates a schematic circuit block diagram of an industrial control apparatus according to an embodiment of the present disclosure.

FIG. 2 illustrates a schematic circuit block diagram of an industrial control apparatus 1000 according to an embodiment of the present disclosure. As shown in FIG. 2, each input or output module 100 comprises a fuse 110 adapted to be coupled between a power supply 800 and a user load 900. As an example, a power supply 800 may be provided by a power junction box 430 of each module group, and the user load 900 may be a load device at an industrial site. The fuse 110 may provide safety protection for the industrial control apparatus 1000 and its modules 100, as well as the user load 900. For example, when a wiring error or failure occurs in the field and causes an excessive current to occur between the power supply 800 and the load 900, the fuse 100 may be blown by the large current, thereby cutting off the circuit between the power supply 800 and the load 900. The fuses 110 may be removably mounted in the module 100, e.g., the fuses 110 may be small modules similar to drawers, so that in the event that the fuses 110 have been blown, an operator may disassemble the corresponding module to remove the fuse 110 as a whole from the module 100 and replace it with a new fuse.

According to embodiments of the present disclosure, each input or output module 100 further comprises a detection assembly 120 coupled to the fuse 110 and configured to send a detection signal after monitoring that the fuse 110 is blown. As an example, the detection assembly 120 can monitor the blown state of the fuse 110 in real time and send a detection signal indicative of the occurrence of a blow after the fuse 110 is blown. By means of the detection assembly 120, a signal for prompting the operator can be sent immediately after the fuse 110 of the corresponding module is blown.

In some embodiments of the present disclosure, the detection assembly 120 comprises at least one resistive devices 121-1 and 121-2 and an isolation device 122, and the isolation device 122 comprises a first side portion and a second side portion, and the first side portion is connected in series with the at least one resistive devices 121-1 and 121-2, and the first side portion and the at least one resistive device 121-1, 121-2 connected series connected are connected in parallel with the fuse 110, and the second side portion is configured to send a valid signal when a current flowing through the first side portion or a voltage applied on the first side portion exceeds a threshold.

As an example, a series detection branch formed by the resistive devices 121-1 and 121-2 and the first side portion of the isolation device 122 is connected across the fuse 110. Thus, when the fuse 110 is not blown, the voltage applied to the series detection branch is close to zero, and almost no current flows on the series detection branch. However, when or after the fuse 110 is blown, the voltage of the power supply 800 will be applied to the series detection branch and thus a certain current will flow through the first side portion of the isolation device 122 or a certain voltage will apply on the first side portion of the isolation device 122. The current and/or voltage signals of the first side portion of the isolation device 122 can be transferred to the second side portion, such as magnetically or optically, to generate an effective electrical signal at the second side portion. In this manner, a valid signal indicative of a blow may be sent immediately if the fuse 110 is blown, and the power circuit including the power supply 800 and the load 900 may be electrically isolated from the control components within the input or output module 100 to protect the control components within the module while implementing the blow monitoring function. In one embodiment, the isolation device 122 comprises an optical coupler. By means of the optical coupler, electrical isolation can be achieved in a simple and efficient manner, and after the fuse 110 is blown, the current flowing through the first side portion of the optical coupler triggers an optical signal so that the second side portion generates a current signal as a valid signal indicating a blow. It will be appreciated that the implementation of the isolation device 122 is not so limited, but may be other types of suitable devices, such as an isolation transformer or a combination of devices, as may accomplish the objectives of the present disclosure.

In some embodiments of the present disclosure, the detection assembly 120 further comprises a control component 123 coupled to the second side portion and the processing device 200 and configured to receive the valid signal and send a detection signal to the processing device 200 (as shown in FIGS. 1 and 2) based on the valid signal. As an example, the control component 123 may comprise a microcontrol unit MCU which may suitably process the electrical signal output by the isolation device 122 and send a detection signal to the processing device 200 for indicating a fusing. The control component 123 may be an existing control unit in the input or output module 100 for implementing the basic functions of the input or output module, i.e., measurement acquisition and process control at the industrial site. Alternatively, the control component 123 may also be a newly added control unit dedicated to fuse monitoring. It can be seen that the use of existing control units in the module is more preferred as this enables multiplexing of the control units thereby reducing the overall cost and complexity. In one embodiment, each of the plurality of input or output modules 100 may also include a communication component 124 for facilitating communication of the control component 123 with the outside of the module. For example, the communication component 124 comprises a communication unit SCMLINK, which may be an existing communication component in the input or output module 100, or may be a newly added component dedicated to fuse monitoring. It is understood that the communication component 124 may not be provided in the input or output module, but the control component 123 directly communicates with the outside, which can also achieve the object of the present disclosure.

According to an embodiment of the present disclosure, the industrial control apparatus 1000 further comprises a processing device 200 communicatively coupled to the detection assembly 120 of each input or output module 100 and configured to output information that the input or output module 100 associated with the detection signal is blown. By way of example, the processing device 200 may be located external to the control cabinet or cabinet 300 or at a location remote from the control cabinet or cabinet 300. In some cases, the processing device 200 may also be referred to as an upper computer, and may process data from an industrial site and send commands to control processes at the industrial site. Since the processing device 200 is communicatively coupled to the detection assembly 120 of the input or output module 100 to receive and process the detection signal from the detection assembly 120, and the processed fusing-related information is provided to the operator in an appropriate manner. For example, the processing device 200 may display the fusing-related information, or record and store the fusing-related information, such as in a log for an operator to query at any time. In addition, the processing device 200 may output or provide fusing-related information to peripheral devices such as smartphones, tablets, etc. In this manner, an operator of the industrial control apparatus 1000 can be informed that a fuse 110 of a module has been blown for timely fuse replacement.

In some embodiments of the present disclosure, the information that the input or output module 100 associated with the detection signal is blown comprises at least one of identification information and location information of the input or output module 100 associated with the detection signal. As an example, the detection signal provided by the input or output module 100 may contain identification information and location information of the module, or the processing device 100 may determine the identification information and location information of the module associated with the detection signal based on the source of the detection signal. With the aid of this information, the operator can determine which or wherein the input or output module 100 with the fuse 110 blown is, and the blown fuse can be accurately found and replaced without spending excessive time and effort.

FIG. 3 illustrates a schematic diagram of a human-machine interface 220 of a processing device 200 according to an embodiment of the present disclosure. The processing device 200 may include a processor or controller 210, such as a central processing unit, for processing the received signals and data. In some embodiments of the present disclosure, the processing device 200 also comprises a human-machine interface 220, wherein the human-machine interface 220 is configured to present information that the input or output module 100 is blown to the operator in the form of at least one of a character, a graphic and a sound.

As an example, the processing device 200 or its human-machine interface 220 may be equipped with engineering tool software for process control in an industrial field. When the engineering tool software is run on the human-machine interface 220, a display interface may be provided for interaction with an operator. Upon occurrence of a blow event, the display interface of the human-machine interface 220 may display which input or output module 100 fuses have been blown. As shown in FIG. 3, each module group can be visually displayed in a drop-down list of a tree, and a list of all input or output modules under the module group can be displayed by clicking on the module group. In case of a fuse of a certain module being blown or having a fault, a mark may be made at the corresponding input or output module, for example a "⊗" mark appears in front of the module AO XXX of the base 2 of the module group A in FIG. 3, to indicate to the operator that the module is blown or having a fault. Further details of the module can be displayed by clicking on the module AO XXX, which for example can indicate that the cause of the failure is that the fuse is blown. It will be appreciated that the implementation of FIG. 3 is merely exemplary and that the operator may be prompted in other suitable ways. For example, after a fuse of an input or output module is blown, the display interface of the human-machine interface 220 may directly display the model or number of the module and the location of the module where the fuse is blown. Alternatively, the operator may also be alerted to which module fuse needs to be replaced with a periodically repeating audible prompt. In this way, the operator can know which module requires replacement of the fuse and quickly locate the module.

Figure 4:
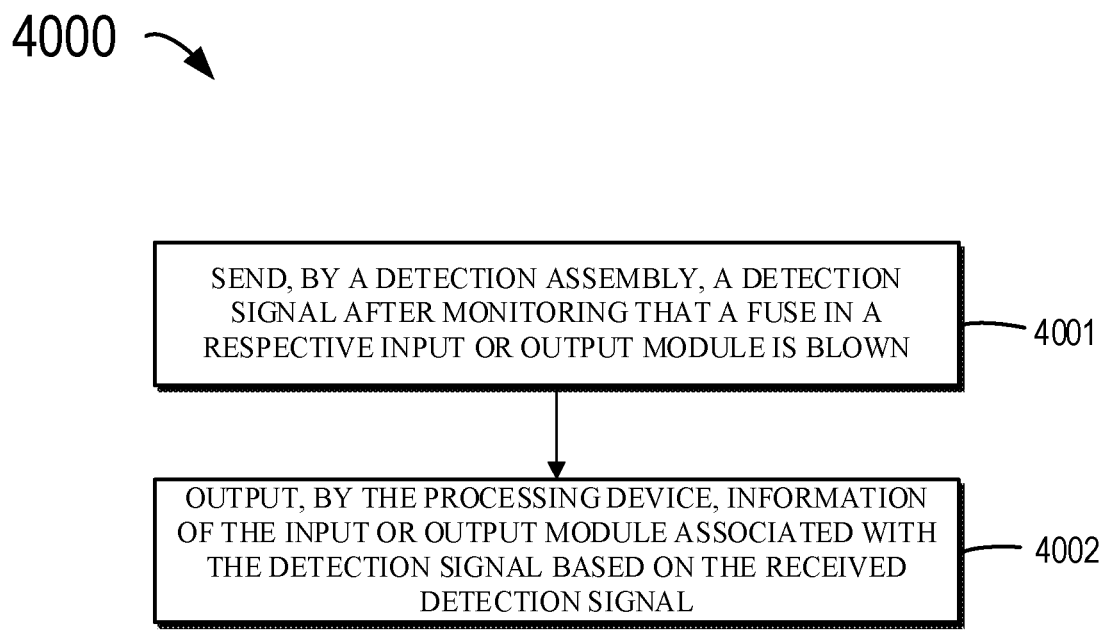
FIG. 4 illustrates a schematic block diagram of a monitoring method for an industrial control apparatus according to an embodiment of the present disclosure.

FIG. 4 illustrates a schematic block diagram of a monitoring method 4000 for an industrial control apparatus 1000 according to an embodiment of the present disclosure. The monitoring method 4000 can be implemented in the industrial control apparatus 1000 and can include the following steps.

At block 4001, a detection signal is sent by the detection assembly 120 after monitoring that a fuse 110 in a respective input or output module 100 is blown, wherein the industrial control apparatus 1000 comprises at least one input or output module 100, and each input or output module 100 comprises the fuse 110 and the detection assembly 120.

In some embodiments of the present disclosure, the detection assembly 120 sending a detection signal after monitoring that the fuse 110 in the respective input or output module 100 is blown comprises: the second side portion of the isolation device 122 sending a valid signal when a current flowing through or a voltage applied to the first side portion of the isolation device 122 exceeds a threshold, and the control component 123 sending the detection signal to the processing device 200 based on the received valid signal.

At block 4002, information that the input or output module 100 associated with the detected signal is blown is output by the processing device 200.

In some embodiments of the present disclosure, the information that the input or output module 100 associated with the detection signal is blown comprises at least one of: identification information and position information of the input or output module 100 associated with the detection signal.

In some embodiments of the present disclosure, the monitoring method 4000 further comprises: providing a human-machine interface 220 to output information that an input or output module 100 associated with the detection signal is blown, wherein the output comprises: presenting information that the input or output module 100 is blown to the operator in the form of at least one of a character, a graphic and a sound through the human-machine interface 220.

Many modifications and other embodiments of the disclosure set forth herein will come to mind to one skilled in the art to which this disclosure pertains having the benefit of the teachings presented in the foregoing descriptions and the associated drawings. Therefore, it is to be understood that the embodiments of the disclosure are not to be limited to the specific embodiments disclosed and that modifications and other embodiments are intended to be included within the scope of the disclosure. In addition, while the above description and related drawings describe example embodiments in the context of certain example combinations of features and/or functions, it should be appreciated that different combinations of features and/or functions may be provided by alternative embodiments without departing from the scope of the present disclosure. In this regard, for example, other combinations of features and/or functions different from those expressly described above are also contemplated as being within the scope of the present disclosure. Although specific terms are employed herein, they are used in a generic and descriptive sense only and not for purposes of limitation.

We claim:

1. An industrial control apparatus, comprising:
at least one input or output module, each input or output module comprising:
a fuse adapted to be coupled between a power supply and a user load; and
a detection assembly coupled to the fuse and configured to send a detection signal after monitoring that the fuse is blown; and
a processing device communicatively coupled to the detection assembly of each input or output module and configured to output information that the input or output module associated with the detection signal is blown
wherein the detection assembly comprises:
at least one resistive device;
an isolation device comprising:
a first side portion connected in series with the at least one resistive device, and the first side portion and the at least one resistive device connected in series being connected in parallel with the fuse; and a second side portion configured to send a valid signal when a current flowing through or a voltage applied to the first side portion exceeds a threshold, and a control component coupled to the second side portion and the processing device, the control component being configured to receive the valid signal and to send the detection signal to the processing device based on the valid signal, wherein the isolation device comprises an optical coupler.

2. The industrial control apparatus of claim 1, wherein the information that the input or output module associated with the detection signal is blown comprises at least one of: identification information and position information of the input or output module associated with the detection signal.

3. The industrial control apparatus of claim 1, wherein the processing device further comprises a human-machine interface configured to present information to the operator in the form of at least one of a character, a graphic and a sound that the input or output module is blown.

4. The industrial control apparatus of claim 1, further comprising:

a cabinet body; and at least one module group arranged in the cabinet, each module group comprising a plurality of bases, the at least one input or output module being mounted on a corresponding base of the corresponding module group, respectively.

5. A monitoring method for an industrial control apparatus, comprising:

sending, by a detection assembly, a detection signal after monitoring that a fuse in a respective input or output module is blown, wherein the industrial control apparatus comprises at least one input or output module, each input or output module comprising the fuse and the detection assembly; and outputting, by the processing device, information that the input or output module associated with the detection signal is blown wherein the detection assembly comprises: at least one resistive device, an isolation device and a control component, the isolation device comprising: a first side portion and a second side portion, the first side portion being connected in series with the at least one resistive device, and the first side portion and the at least one resistive device connected in series being connected in parallel with the fuse, the control component being coupled to the second side portion and the processing device, and wherein sending, by the detection assembly, a detection signal after monitoring that a fuse in a respective input or output module is blown comprising:

sending, by the second side portion of the isolation device, a valid signal when a current flowing through or a voltage applied to the first side portion exceeds a threshold, and sending, by the control component, the detection signal to the processing device based on the received valid signal, wherein the isolation device comprises an optical coupler.

6. The monitoring method of claim 5, wherein the information that the input or output module associated with the detection signal is blown comprises at least one of: identification and position information of the input or output module associated with the detection signal.

7. The monitoring method of claim 5, further comprising:

outputting, by a human-machine interface, information that an input or output module associated with the detection signal is blown, wherein the outputting comprises: presenting information that the input or output module is blown to the operator in the form of at least one of a character, a graphic and a sound through the human-machine interface.

* * * * *